(12) United States Patent
Tsutsui et al.

(10) Patent No.: US 10,298,191 B2
(45) Date of Patent: *May 21, 2019

(54) POWER AMPLIFIER MODULE

(71) Applicant: Murata Manufacturing Co., Ltd., Kyoto (JP)

(72) Inventors: Takayuki Tsutsui, Kyoto (JP); Tadashi Matsuoka, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/890,490

(22) Filed: Feb. 7, 2018

(65) Prior Publication Data

US 2018/0226933 A1 Aug. 9, 2018

Related U.S. Application Data

(63) Continuation of application No. 15/588,884, filed on May 8, 2017, now Pat. No. 9,923,533, which is a (Continued)

(51) Int. Cl.
*H03G 3/30* (2006.01)
*H03F 1/02* (2006.01)
(Continued)

(52) U.S. Cl.
CPC ............. *H03G 3/3042* (2013.01); *G05F 1/56* (2013.01); *H03F 1/0211* (2013.01);
(Continued)

(58) Field of Classification Search
CPC ...... H03F 1/0211; H03F 1/0261; H03F 3/211; H03F 3/245; H03F 2200/408;
(Continued)

(56) References Cited

U.S. PATENT DOCUMENTS 6,388,528 B1 5/2002 Buer
7,193,459 B1 3/2007 Epperson
(Continued)

FOREIGN PATENT DOCUMENTS

JP 2009-100197 A 5/2009

*Primary Examiner* — Steven J Mottola
*Assistant Examiner* — Hafizur Rahman
(74) *Attorney, Agent, or Firm* — Pearne & Gordon LLP

(57) ABSTRACT

In a power amplifier module for performing slope control of a transmitting signal, a gain variation due to a variation in battery voltage is suppressed while suppressing an increase in circuit size. The power amplifier module includes: a first regulator for outputting a first voltage corresponding to a control voltage for controlling a signal level; a second regulator for outputting a second voltage that rises as a battery voltage drops; a first amplifier supplied with the first voltage as a power-supply voltage to amplify an input signal and output an amplified signal; and a second amplifier for amplifying the amplified signal, wherein the second amplifier includes a first amplification unit supplied with the second voltage as the power-supply voltage to amplify the amplified signal, and a second amplification unit supplied with the battery voltage as the power-supply voltage to amplify the amplified signal.

8 Claims, 7 Drawing Sheets

Related U.S. Application Data continuation of application No. 14/831,379, filed on Aug. 20, 2015, now Pat. No. 9,685,911.

(60) Provisional application No. 62/047,867, filed on Sep. 9, 2014.

(51) Int. Cl.

| | | |
|---|---|---|
| *H03F 3/193* | (2006.01) | |
| *H03F 3/21* | (2006.01) | |
| *H03F 3/24* | (2006.01) | |
| *H03G 3/00* | (2006.01) | |
| *G05F 1/56* | (2006.01) | |
| *H03F 3/19* | (2006.01) | |

(52) U.S. Cl.
CPC ......... *H03F 1/0216* (2013.01); *H03F 1/0261* (2013.01); *H03F 3/19* (2013.01); *H03F 3/193* (2013.01); *H03F 3/21* (2013.01); *H03F 3/211* (2013.01); *H03F 3/245* (2013.01); *H03G 3/007* (2013.01); *H03G 3/3047* (2013.01); *H03F 2200/18* (2013.01); *H03F 2200/222* (2013.01); *H03F 2200/318* (2013.01); *H03F 2200/387* (2013.01); *H03F 2200/408* (2013.01); *H03F 2200/451* (2013.01); *H03F 2203/21106* (2013.01); *H03F 2203/21142* (2013.01)

(58) Field of Classification Search
CPC ..... H03F 2200/451; H03F 2203/21106; H03F 2203/21142
USPC ....... 330/127, 199, 261, 279, 291, 295–297; 323/226, 242, 280, 303
See application file for complete search history.

(56) References Cited

U.S. PATENT DOCUMENTS

| | | | |
|---|---|---|---|
| 7,605,651 | B2 | 10/2009 | Ripley |
| 7,839,218 | B2 | 11/2010 | Shimamoto |
| 8,018,287 | B2 | 9/2011 | Shimamoto |
| 9,923,533 | B2 * | 3/2018 | Tsutsui ................ H03G 3/3042 |
| 2011/0298545 | A1 | 12/2011 | Morimoto |
| 2013/0033244 | A1 | 2/2013 | Ock |

* cited by examiner

POWER AMPLIFIER MODULE

CROSS-REFERENCE TO RELATED APPLICATIONS

This application is a continuation of U.S. Utility application Ser. No. 15/588,884 filed on May 8, 2017, which claims priority of U.S. Utility application Ser. No. 14/831,379 filed on Aug. 20, 2015 which claims priority to U.S. Provisional Application Ser. No. 62/047,867, filed on Sep. 9, 2014. The contents of these applications are incorporated herein by reference in their entireties.

BACKGROUND OF THE INVENTION

Field of the Invention

The present invention relates to a power amplifier module.

Background Art

In a mobile communication device such as a mobile phone, a power amplifier module is used to amplify the power of a radio frequency (RF) signal to be transmitted to a base station. For example, in GSM® (Global System for Mobile Communications), the gain of the power amplifier module is controlled to realize the slope control (ramp up and ramp down) of a transmitting signal from the mobile communication device to the base station.

For example, Patent Document 1 discloses a configuration for supplying voltage $V_{LDO}$ output from an LDO (Low Drop Out) regulator to a collector terminal of each stage of a three-stage amplifier in a power amplifier module. In this configuration, the level of the voltage $V_{LDO}$ is adjusted based on control voltage $V_{RAMP}$ to control the gain of the power amplifier module.

Patent Document 2 discloses a configuration in a power amplifier module including a three-stage amplifier, where voltage $V_{REG}$ output from an LDO regulator is supplied to first stage and second stages, and constant power-supply voltage is supplied to a third stage.

CITATION LIST

Patent Documents

[Patent Document 1] JP 2009-100197 A
[Patent Document 2] U.S. Pat. No. 7,605,651

SUMMARY OF THE INVENTION

In the configuration disclosed in Patent Document 1, the voltage $V_{LDO}$ from the LDO regulator is supplied to each stage of the three-stage amplifier. In this configuration, however, there is a need to pass large current through an output stage (third stage), and this requires a large-sized p-channel MOSFET that forms part of the LDO regulator, resulting in an increase in the circuit size of the power amplifier module.

In the configuration disclosed in Patent Document 2, battery voltage is supplied to the output stage (third stage) of the three-stage amplifier. As compared with the configuration disclosed in Patent Document 1, this configuration can reduce the size of the p-channel MOSFET that forms part of the LDO regulator. However, when the battery voltage varies, the gain of the third stage amplifier also varies. Therefore, in the configuration disclosed in Patent Document 2, loop control using a coupler to detect the level of an output signal in order to adjust the voltage $V_{REG}$ output from the LDO regulator is adopted. This results in an increase in the circuit size of the power amplifier module.

The present disclosure has been made in view of such circumstances, and it is an object thereof to suppress a gain variation due to a variation in battery voltage while suppressing an increase in circuit size in a power amplifier module for performing slope control of a transmitting signal.

A power amplifier module according to one aspect of the present disclosure includes: a first regulator for outputting a first voltage corresponding to a control voltage for controlling a signal level; a second regulator for outputting a second voltage that rises as a battery voltage drops; a first amplifier supplied with the first voltage as a power-supply voltage to amplify an input signal and output an amplified signal; and a second amplifier for amplifying the amplified signal, wherein the second amplifier includes a first amplification unit supplied with the second voltage as the power-supply voltage to amplify the amplified signal, and a second amplification unit supplied with the battery voltage as the power-supply voltage to amplify the amplified signal.

According to the present disclosure, a gain variation due to a variation in power-supply voltage can be suppressed while suppressing an increase in circuit size in a power amplifier for performing slope control of a transmitting signal.

DESCRIPTION OF AN EXAMPLE EMBODIMENT

Figure 1:
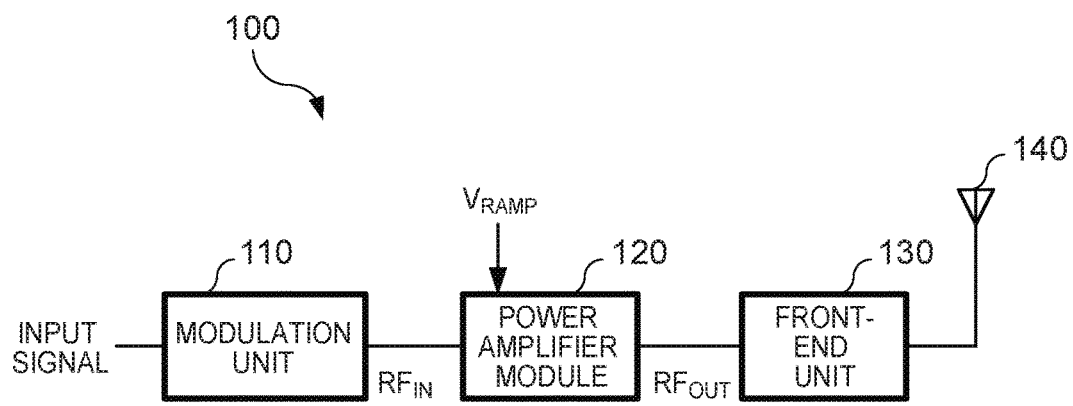
FIG. 1 is a diagram illustrating a configuration example of a transmitting unit including a power amplifier module as one embodiment of the present disclosure.

Embodiments of the present disclosure will be described below with reference to the accompanying drawings. FIG. 1 is a diagram illustrating a configuration example of a transmitting unit including a power amplifier module as one embodiment of the present disclosure. The transmitting unit 100 is used, for example, in a mobile communication device such as a mobile phone to transmit various signals such as voice and data to a base station. Although the mobile communication device also includes a receiving unit for receiving signals from the base station, the description thereof will be omitted here.

As illustrated in FIG. 1, the transmitting unit 100 includes a modulation unit 110, a power amplifier module 120, a front-end unit 130, and an antenna 140.

The modulation unit 110 modulates an input signal based on a GSM® modulation system to generate a radio frequency (RF) signal in order to perform radio transmission. For example, the RF signal ranges from about hundreds of MHz to about several GHz. Note that the embodiments will be described based on the GSM® modulation system, but the application range of the present disclosure is not limited thereto.

The power amplifier module 120 amplifies the power of the RF signal ($RF_{IN}$) to a level necessary for transmission to a base station, and outputs the amplified signal ($RF_{OUT}$). Further, the power amplifier module 120 controls gain based on control voltage $V_{RAMP}$ for controlling the signal level to perform slope control of the amplified signal.

The front-end unit 130 performs filtering on the amplified signal, switching to a received signal received from the base station, and the like. The amplified signal output from the front-end unit 130 is transmitted to the base station through the antenna 140.

Figure 2:
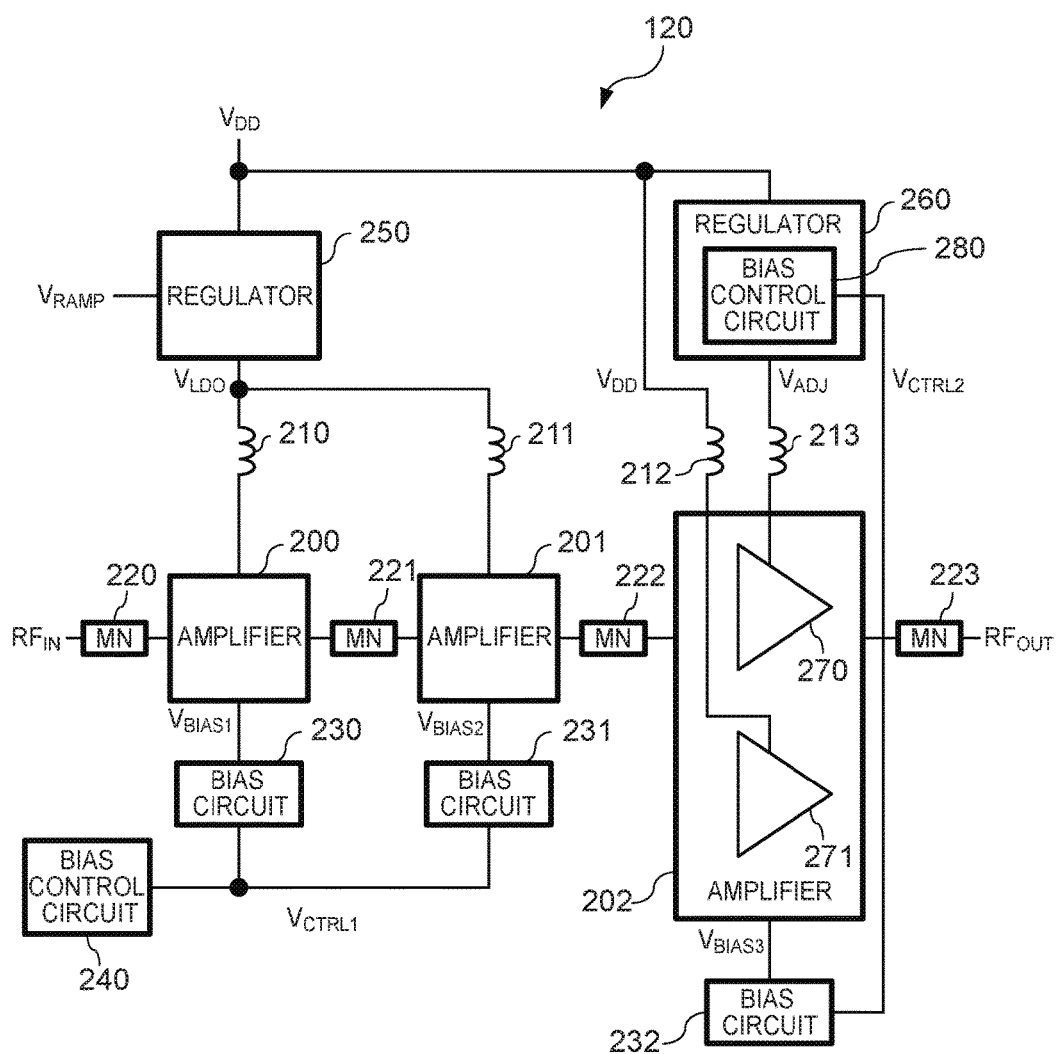
FIG. 2 is a diagram illustrating an example of the configuration of the power amplifier module.

FIG. 2 is a diagram illustrating an example of the configuration of the power amplifier module 120. The power amplifier module 120 includes amplifiers 200 to 202, inductors 210 to 213, matching circuits (MN: Matching Network) 220 to 223, bias circuits 230 to 232, a bias control circuit 240, and regulators 250 and 260.

The amplifiers 200 to 202 constitute a three-stage amplifier circuit. The amplifier 200 amplifies an input RF signal and outputs the amplified signal. The amplifier 201 (first amplifier) amplifies the RF signal output from the amplifier 200 and outputs the amplified signal. The amplifier 202 (second amplifier) amplifies the RF signal output from the amplifier 201 and outputs the amplified signal. Each of the amplifiers 200 to 202 includes a multi-finger transistor such as an HBT (Heterojunction Bipolar Transistor) as an amplifying element. The voltage $V_{ADJ}$ is supplied as the power-supply voltage to an amplification unit 270 (first amplification unit) as one part of the amplifier 202 (as some fingers), and the battery voltage $V_{DD}$ is supplied as the power-supply voltage to an amplification unit 271 (second amplification unit) as the other part of the amplifier 202 (as some other fingers). The matching circuits 220 to 223 are provided before and behind the amplifiers 200 to 202 to match the impedance between the circuits, respectively.

The bias circuits 230 to 232 supply bias voltages $V_{BIAS1}$, $V_{BIAS3}$ to the bases of transistors that constitute the amplifiers 200 to 202, respectively. The bias voltages $V_{BIAS1}$ and $V_{BIAS2}$ supplied from the bias circuits 230 and 231 are controlled by the bias control circuit 240. Further, the bias voltage $V_{BIAS3}$ supplied from the bias circuit 232 is controlled by a bias control circuit 280 included in the regulator 260.

The bias control circuit 240 outputs bias control voltage $V_{CTRL1}$ for controlling the bias voltages $V_{BIAS1}$ and $V_{BIAS2}$ supplied from the bias circuits 230 and 231. The bias control circuit 240 outputs, for example, a predetermined level of bias control voltage $V_{CTRL1}$ irrespective of the battery voltage $V_{DD}$.

The regulator 250 (first regulator) outputs voltage $V_{LDO}$ (first voltage) corresponding to the control voltage $V_{RAMP}$ based on the battery voltage $V_{DD}$. The voltage $V_{LDO}$ is supplied as the power-supply voltage to the collectors of the transistors that constitute the amplifiers 200 and 201 through the inductors 210 and 211. In the power amplifier module 120, the voltage $V_{LDO}$ is adjusted according to the control voltage $V_{RAMP}$ to perform slope control.

The regulator 260 (second regulator) outputs voltage $V_{ADJ}$ (second voltage) that rises as the battery voltage $V_{DD}$ drops. The voltage $V_{ADJ}$ is supplied as the power-supply voltage to the collector of the amplification unit 270 of the amplifier 202 through the inductor 213. The regulator 260 includes the bias control circuit 280. The bias control circuit 280 outputs bias control voltage $V_{CTRL2}$ for controlling the bias voltage $V_{BIAS3}$ based on the battery voltage $V_{DD}$. Specifically, the bias control circuit 280 adjusts the bias control voltage $V_{CTRL2}$ to increase the bias voltage $V_{BIAS3}$ as the battery voltage $V_{DD}$ drops.

Figure 3:
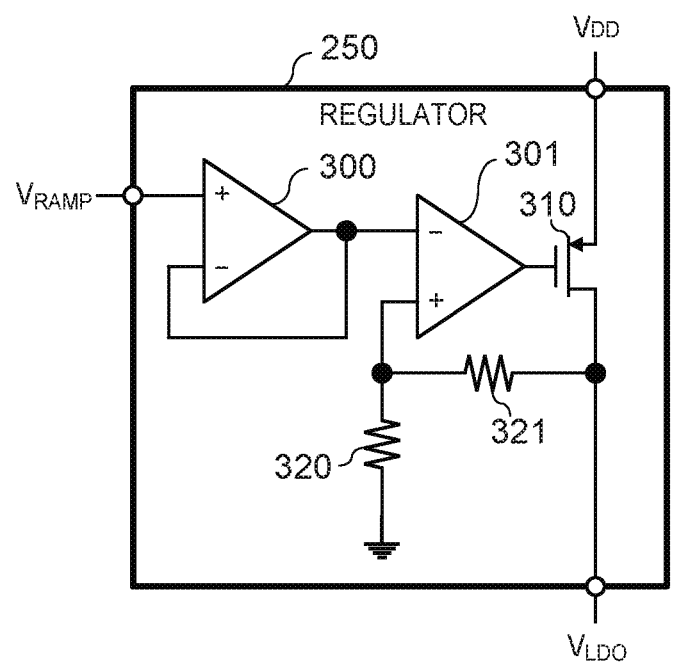
FIG. 3 is a diagram illustrating an example of the configuration of a regulator for first stage and second stage amplifiers.

FIG. 3 is a diagram illustrating an example of the configuration of the regulator 250. The regulator 250 includes operational amplifiers 300 and 301, a p-channel MOSFET 310, and resistors 320 and 321.

The control voltage $V_{RAMP}$ is applied to the non-inverting input terminal of the operational amplifier 300, and the inverting input terminal and the output terminal are connected. In other words, the operational amplifier 300 acts as a voltage follower for outputting the control voltage $V_{RAMP}$. The control voltage $V_{RAMP}$ output from the operational amplifier 300 is applied to the inverting input terminal of the operational amplifier 301. The output terminal of the operational amplifier 301 is connected to the gate of the p-channel MOSFET 310. The battery voltage $V_{DD}$ is applied to the source of the p-channel MOSFET 310. One end of the resistor 320 is connected to the non-inverting input terminal of the operational amplifier 301, and the other end is grounded. One end of the resistor 321 is connected to the non-inverting input terminal of the operational amplifier 301, and the other end is connected to the drain of the p-channel MOSFET 310. The operational amplifier 301, the p-channel MOSFET 310, and the resistors 320 and 321 constitute an LDO regulator, and voltage $V_{LDO}$ corresponding to the control voltage $V_{RAMP}$ is output from the drain of the p-channel MOSFET 310.

Figure 4:
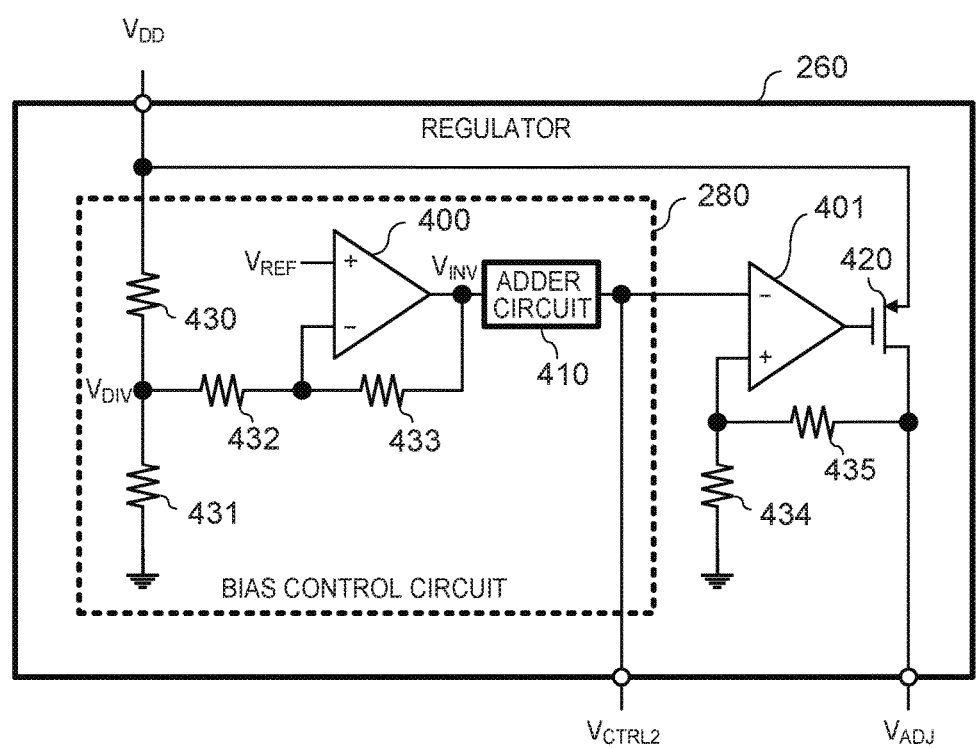
FIG. 4 is a diagram illustrating an example of the configuration of a regulator for a third stage amplifier.

FIG. 4 is a diagram illustrating an example of the configuration of the regulator 260. The regulator 260 includes operational amplifiers 400 and 401, an adder circuit 410, a p-channel MOSFET 420, and resistors 430 to 435. Note that the operational amplifier 400, the adder circuit 410, and resistors 430 to 433 constitute the bias control circuit 280.

Reference voltage $V_{REF}$ is applied to the non-inverting input terminal of the operational amplifier 400. The battery voltage $V_{DD}$ is applied to one end of the resistor 430, and the other end of the resistor 430 is connected to one end of the resistor 431. Then, the other end of the resistor 431 is grounded. Voltage $V_{DIV}$ (third voltage) corresponding to the battery voltage $V_{DD}$ is generated at the connecting point between the resistors 430 and 431. The voltage $V_{DIV}$ is applied to one end of the resistor 432, and the other end of the resistor 432 is connected to the inverting input terminal of the operational amplifier 400. One end of the resistor 433 is connected to the inverting input terminal of the operational amplifier 400, and the other end of the resistor 433 is connected to the output terminal of the operational amplifier

400. The operational amplifier 400 and the resistors 430 to 433 constitute an inverting amplifier circuit to output voltage $V_{INV}$ (fourth voltage) obtained by inversely amplifying the voltage $V_{DIV}$. In other words, the voltage $V_{INV}$ rises as the battery voltage $V_{DD}$ drops.

The adder circuit 410 outputs bias control voltage $V_{CTRL2}$ obtained by adding a predetermined level of voltage to the voltage $V_{INV}$. Note that the adder circuit 410 is provided to adjust the voltage $V_{INV}$ to a level for controlling the bias circuit 232. Since the voltage $V_{INV}$ rises as the battery voltage $V_{DD}$ drops, the bias control voltage $V_{CTRL2}$ also rises as the battery voltage $V_{DD}$ drops.

The bias control voltage $V_{CTRL2}$ output from the adder circuit 410 is applied to the inverting input terminal of the operational amplifier 401. The output terminal of the operational amplifier 401 is connected to the gate of the p-channel MOSFET 420. The battery voltage $V_{DD}$ is applied to the source of the p-channel MOSFET 420. One end of the resistor 434 is connected to the non-inverting input terminal of the operational amplifier 401, and the other end is grounded. One end of the resistor 435 is connected to the non-inverting input terminal of the operational amplifier 401, and the other end of the resistor 435 is connected to the drain of the p-channel MOSFET 420. The operational amplifier 401, the p-channel MOSFET 420, and resistors 434 and 435 constitute an LDO regulator, and voltage $V_{ADJ}$ corresponding to the bias control voltage $V_{CTRL2}$ is output from the drain of the p-channel MOSFET 420. Since the bias control voltage $V_{CTRL2}$ rises as the battery voltage $V_{DD}$ drops, the voltage $V_{ADJ}$ also rises as the battery voltage $V_{DD}$ drops.

In the power amplifier module 120 having the configuration illustrated in FIG. 2 to FIG. 4, voltage $V_{LDO}$ corresponding to the control voltage $V_{RAMP}$ for controlling the signal level is supplied as the power-supply voltage to the first stage amplifier 200 and the second stage amplifier 201, but not supplied to the third stage amplifier 202. Then, voltage $V_{ADJ}$ that rises as the battery voltage $V_{DD}$ drops is supplied as the power-supply voltage to the amplification unit 270 of the third stage amplifier 202, and the battery voltage $V_{DD}$ is supplied as the power-supply voltage to the amplification unit 271 of the third stage amplifier 202.

Thus, in the power amplifier module 120, the size of the p-channel MOSFET 310 that forms part of the regulator 250 can be reduced compared with the configuration in which the voltage $V_{LDO}$ is supplied to the third stage amplifier 202 as the power-supply voltage. Further, in the power amplifier module 120, the voltage $V_{ADJ}$ supplied to the amplification unit 270 of the third stage amplifier 202 rises as the battery voltage $V_{DD}$ drops. Therefore, a gain variation due to a drop in battery voltage $V_{DD}$ can be suppressed.

Further, in the power amplifier module 120, the bias control circuit 280 outputs bias control voltage $V_{CTRL2}$ that rises as the battery voltage $V_{DD}$ drops. This causes the bias voltage $V_{BIAS3}$ supplied to the third stage amplifier 202 to rise as the battery voltage $V_{DD}$ drops. Therefore, a gain variation due to a drop in battery voltage $V_{DD}$ can be suppressed.

Referring to FIG. 5 to FIG. 9, a suppressive effect on the gain variation in the power amplifier module 120 will be described.

Figure 5:
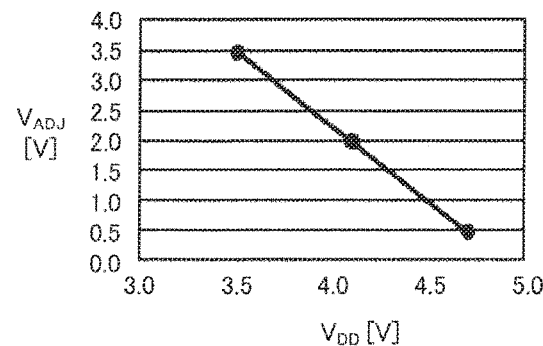
FIG. 5 is a graph illustrating an example of the relationship between battery voltage $V_{DD}$ and voltage $V_{ADJ}$ in the power amplifier module.

FIG. 5 is a graph illustrating an example of the relationship between battery voltage $V_{DD}$ and voltage $V_{ADJ}$ in the power amplifier module 120. As illustrated in FIG. 5, the voltage $V_{ADJ}$ rises as the battery voltage $V_{DD}$ drops. Specifically, for example, when the battery voltage $V_{DD}$ is about 4.7 V, voltage $V_{ADJ}$ is about 0.5 V, whereas when the battery voltage $V_{DD}$ is about 3.5 V, voltage $V_{ADJ}$ is about 3.5 V.

Figure 6:
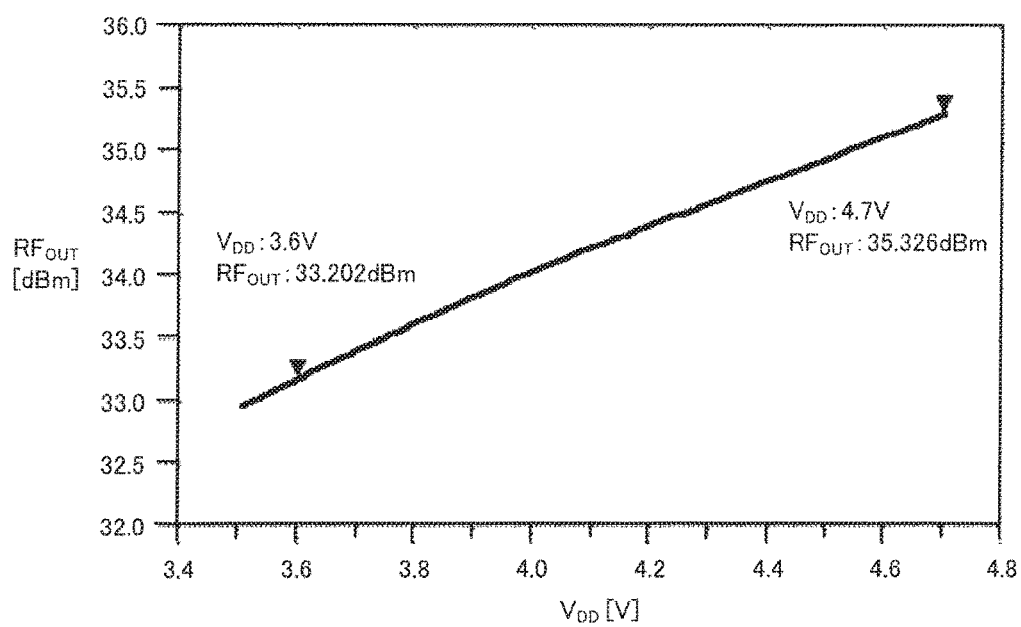
FIG. 6 is a graph of simulation results illustrating an example of output variations when the battery voltage $V_{DD}$ is supplied as power-supply voltage to the entire third stage amplifier to fix bias voltage $V_{BIAS3}$ supplied to the third stage amplifier to a predetermined level.

FIG. 6 is a graph of simulation results illustrating an example of variations in output ($RF_{OUT}$) when the battery voltage $V_{DD}$ is supplied as the power-supply voltage to the entire third stage amplifier 202 to fix the bias voltage $V_{BIAS3}$ supplied to the third stage amplifier 202 to a predetermined level. In the simulation results illustrated in FIG. 6, when the battery voltage $V_{DD}$ is 4.7 V, output is 35.326 dBm, whereas when the battery voltage $V_{DD}$ is 3.6 V, output is 33.202 dBm. In other words, the amount of decrease in output when the battery voltage $V_{DD}$ drops from 4.7 V to 3.6 V is about 2.1 dBm.

Figure 7:
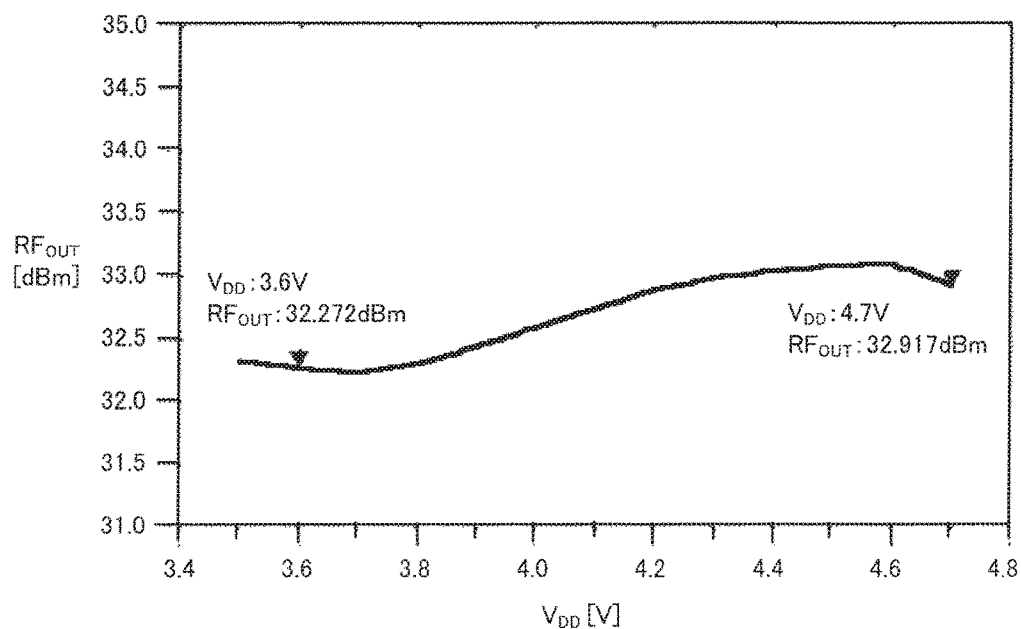
FIG. 7 is a graph of simulation results illustrating an example of output variations when the voltage $V_{ADJ}$ is supplied as the power-supply voltage to part of the third stage amplifier and the battery voltage $V_{DD}$ is supplied as the power-supply voltage to the remaining part of the third stage amplifier.

FIG. 7 is a graph of simulation results illustrating an example of variations in output ($RF_{OUT}$) when the voltage $V_{ADJ}$ is supplied as the power-supply voltage to the amplification unit 270 of the third stage amplifier 202, and the battery voltage $V_{DD}$ is supplied as the power-supply voltage to the amplification unit 271 of the third stage amplifier 202. Note that the amplification unit 270 of the amplifier 202 accounts for about 30% of the amplifier 202. Further, the bias voltage $V_{BIAS3}$ supplied to the third stage amplifier 202 is fixed to a predetermined level to make clear the effect of the voltage $V_{ADJ}$. In the simulation results illustrated in FIG. 7, when the battery voltage $V_{DD}$ is 4.7 V, the output is 32.917 dBm, whereas when the battery voltage $V_{DD}$ is 3.6 V, the output is 32.272 dBm. In other words, the amount of decrease in output when the battery voltage $V_{DD}$ drops from 4.7 V to 3.6 V is about 0.6 dB. As compared with the case illustrated in FIG. 6, the amount of decrease in output is reduced by about 1.5 dB.

According to the simulation results in FIG. 6 and FIG. 7, the amount of decrease in output due to a drop in battery voltage $V_{DD}$ can be reduced by supplying, as the power-supply voltage, the voltage $V_{ADJ}$ that rises as the battery voltage $V_{DD}$ drops to the amplification unit 270 of the third stage amplifier 202. In other words, in the power amplifier module 120, the voltage $V_{ADJ}$ that rises as the battery voltage $V_{DD}$ drops is supplied as the power-supply voltage to part of the third stage amplifier 202 to enable the suppression of gain variations.

Figure 8:
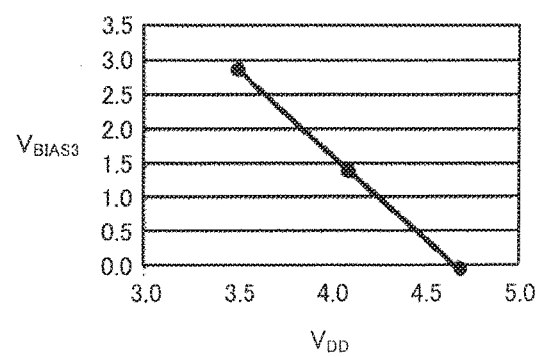
FIG. 8 is a graph illustrating an example of the relationship between battery voltage $V_{DD}$ and bias voltage $V_{BIAS3}$ in the power amplifier module.

FIG. 8 is a graph illustrating an example of the relationship between battery voltage $V_{DD}$ and bias voltage $V_{BIAS3}$ in the power amplifier module 120. As illustrated in FIG. 8, the bias voltage $V_{BIAS3}$ rises as the battery voltage $V_{DD}$ drops. Specifically, for example, when the battery voltage $V_{DD}$ is about 4.7 V, the bias voltage $V_{BIAS3}$ is about 0 V, whereas when the battery voltage $V_{DD}$ is about 3.5 V, the bias voltage $V_{BIAS3}$ is about 2.9 V.

Figure 9:
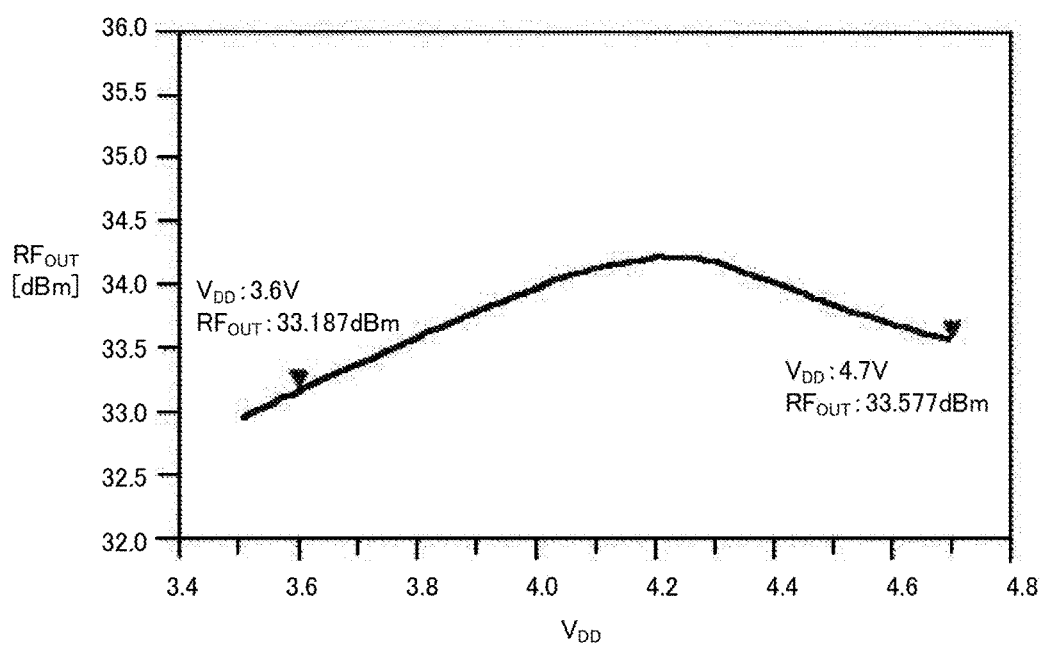
FIG. 9 is a graph of simulation results illustrating an example of output variations when the bias voltage $V_{BIAS3}$ supplied to the third stage amplifier is varied according to the battery voltage $V_{DD}$ as illustrated in FIG. 8.

FIG. 9 is a graph of simulation results illustrating an example of variations in output ($RF_{OUT}$) when the bias voltage $V_{BIAS3}$ supplied to the third stage amplifier 202 is varied according to the battery voltage $V_{DD}$ as illustrated in FIG. 8. Note that the battery voltage $V_{DD}$ is supplied as the power-supply voltage to the entire third stage amplifier 202 to make clear the effect of the bias voltage $V_{BIAS3}$. In the simulation results illustrated in FIG. 9, when the battery voltage $V_{DD}$ is 4.7 V, the output is 33.577 dBm, whereas when the battery voltage $V_{DD}$ is 3.6 V, the output is 33.187 dBm. In other words, the amount of decrease in output when the battery voltage $V_{DD}$ drops from 4.7 V to 3.6 V is about 0.4 dB. As compared with the case illustrated in FIG. 6, the amount of decrease in output is reduced by about 1.7 dB.

According to the simulation results in FIG. 6 and FIG. 9, the amount of decrease in output due to a drop in battery voltage $V_{DD}$ can be reduced by supplying, to the third stage amplifier 202, the bias voltage $V_{BIAS3}$ that rises as the battery voltage $V_{DD}$ drops. In other words, in the power amplifier module 120, the bias voltage $V_{BIAS3}$ that rises as the battery voltage $V_{DD}$ drops is supplied to the third stage amplifier 202 to enable the suppression of gain variations.

As described above, according to the embodiment, the voltage $V_{ADJ}$ that rises as the battery voltage $V_{DD}$ drops is supplied as the power-supply voltage to the amplification unit 270 as one part of the third stage amplifier 202, and the battery voltage $V_{DD}$ is supplied as the power-supply voltage to the amplification unit 271 as the other part of the third stage amplifier 202. According to such a configuration, the size of the p-channel MOSFET 310 in the regulator 250 for the first stage amplifier 200 and the second stage amplifier 201 can be reduced. Further, a gain variation due to a variation in battery voltage $V_{DD}$ can be suppressed without necessarily performing loop control using a coupler. Therefore, the gain variation due to the variation in battery voltage can be suppressed while suppressing an increase in circuit size.

Further, according to the embodiment, the bias voltage $V_{BIAS3}$ that rises as the battery voltage $V_{DD}$ drops is supplied to the third stage amplifier 202. In such a configuration, the gain variation due to the variation in battery voltage can also be suppressed while suppressing an increase in circuit size.

The above-described embodiments are intended to facilitate the understanding of the present disclosure, and not to limit the disclosure. The present disclosure can be modified and improved without departing from the spirit of the disclosure, and equivalents shall be included in the present disclosure.

For example, either or both of the power-supply voltage and the bias voltage supplied to the third stage amplifier 202 may be controlled according to the battery voltage in the power amplifier module 120.

DESCRIPTION OF REFERENCE NUMERALS

100 transmitting unit
110 modulation unit
120 power amplifier module
130 front-end unit
140 antenna
200 to 202 amplifier
210 to 213 inductor
220 to 223 matching circuit
230, 231, 232 bias circuit
240, 280 bias control circuit
250, 260 regulator
270, 271 amplification unit
300, 301, 400, 401 operational amplifier
310, 420 p-channel MOSFET
320, 321, 430 to 435 resistor
410 adder circuit

What is claimed is:

1. A power amplifier module comprising:
    a first amplifier for amplifying an input signal and outputting an amplified signal;
    a second amplifier for amplifying the amplified signal; and
    a bias control circuit for increasing a bias voltage to be supplied to the second amplifier as a battery voltage drops,
    wherein the second amplifier includes a first amplification unit supplied with an output voltage that rises as the battery voltage drops as a power-supply voltage to amplify the amplified signal, and a second amplification unit supplied with the battery voltage as the power-supply voltage to amplify the amplified signal.

2. The power amplifier module according to claim 1, further comprising:
    an inverting amplifier circuit for inversely amplifying a first current corresponding to the battery voltage to output a second current, and
    a low drop-out regulator for outputting the output voltage based on the second current.

3. The power amplifier module according to claim 1, wherein
    the second amplifier is a multi-finger transistor, and
    the first amplification unit of the second amplifier is composed of one or more fingers of the multi-finger transistor, and the second amplification unit of the second amplifier is composed of remaining one or more fingers of the multi-finger transistor.

4. The power amplifier module according to claim 2, wherein
    the second amplifier is a multi-finger transistor, and
    the first amplification unit of the second amplifier is composed of one ore more fingers of the multi-finger transistor, and the second amplification unit of the second amplifier is composed of remaining one or more fingers of the multi-finger transistor.

5. The power amplifier module according to claim 1, wherein a signal output by the second amplifier varies 1.0 dB or less when the power-supply voltage drops from 4.7 V to 3.6 V.

6. The power amplifier module according to claim 1, wherein a signal output by the second amplifier varies 0.6 dB or less when the power-supply voltage drops from 4.7 V to 3.6 V.

7. The power amplifier module according to claim 1, wherein a signal output by the second amplifier varies 0.4 dB or less when the power-supply voltage drops from 4.7 V to 3.6 V.

8. The power amplifier module according to claim 1, wherein the power amplifier module does not perform a loop control by detecting a level of an output of the second amplifier for adjusting the output voltage.

* * * * *